US010062545B2

(12) United States Patent
Kamiya et al.

(10) Patent No.: US 10,062,545 B2
(45) Date of Patent: Aug. 28, 2018

(54) APPARATUS AND METHOD FOR PROCESSING SUBSTRATE USING ION BEAM

(71) Applicant: CANON ANELVA CORPORATION, Kawasaki-shi, Kanagawa-ken (JP)

(72) Inventors: Yasushi Kamiya, Fuchu (JP); Einstein Noel Abarra, Hachioji (JP); Yuta Konno, Kawasaki (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 418 days.

(21) Appl. No.: 15/062,692

(22) Filed: Mar. 7, 2016

(65) Prior Publication Data
US 2016/0189925 A1    Jun. 30, 2016

Related U.S. Application Data

(62) Division of application No. 13/315,567, filed on Dec. 9, 2011, now Pat. No. 9,312,102.

(30) Foreign Application Priority Data

Dec. 13, 2010 (JP) .................................. 2010-276556

(51) Int. Cl.
*H01J 37/302* (2006.01)
*H01J 37/305* (2006.01)
*G05B 15/02* (2006.01)

(52) U.S. Cl.
CPC ............ *H01J 37/302* (2013.01); *G05B 15/02* (2013.01); *H01J 37/3053* (2013.01); *H01J 2237/0044* (2013.01); *H01J 2237/043* (2013.01); *H01J 2237/334* (2013.01)

(58) Field of Classification Search
CPC .............. G05B 15/02; H01J 2237/0044; H01J 2237/043; H01J 2237/334; H01J 37/302; H01J 37/3053
USPC ............. 204/298.32, 298.36, 192.33, 192.34
See application file for complete search history.

(56) References Cited

U.S. PATENT DOCUMENTS 6,224,718 B1    5/2001    Meyer
6,610,987 B2    8/2003    Kimura et al.

FOREIGN PATENT DOCUMENTS

JP    2002-075968 A    3/2002
JP    2002-353172 A    12/2002

*Primary Examiner* — Rodney G McDonald
(74) *Attorney, Agent, or Firm* — Buchanan Ingersoll & Rooney PC

(57) ABSTRACT

A computer-readable recording medium encoded with a computer program for executing an ion etching method of etching a substrate arranged on a substrate holder using an ion beam etching apparatus. The computer program includes a decremental control program having a command according to which the first step is executed; and an incremental control program having a command according to which the second step is executed.

3 Claims, 5 Drawing Sheets

APPARATUS AND METHOD FOR PROCESSING SUBSTRATE USING ION BEAM

The present application is a division of U.S. Ser. No. 13/315,567, which was filed on Dec. 9, 2011, and which claims the priority of JP 2010-276556, which was filed in Japan on Dec. 13, 2010. The subject matter of U.S. Ser. No. 13/315,567 and JP 2010-276556 is incorporated herein by reference.

BACKGROUND OF THE INVENTION

Field of the Invention

The present invention relates, for example, to an ion beam etching method, an ion beam etching apparatus, a recording medium, and a method of manufacturing a semiconductor element, and, more particularly, to an ion beam etching method, an ion beam etching apparatus, and a recording medium which can prevent the occurrence of ESD.

Description of the Related Art

In an ion beam etching process, a substrate arranged on a substrate holder is irradiated with positive ions (ion beam) and etched. An ion beam etching apparatus includes an ion source which extracts positive ions from a plasma using an extraction electrode, and a substrate holder which is placed at the position where it squarely faces the ion source, and holds a substrate in a vacuum. In general, the ion beam etching apparatus also includes an electron source (neutralizer) which emits electrons to neutralize the positive ions extracted from the ion source, a shutter device which is placed between the ion source and the substrate holder, and shields the ion beam, and an exhaust device which evacuates a process chamber into a vacuum (see, for example, Japanese Patent Laid-Open No. 2002-353172).

The substrate is etched by the extracted ion beam. At this time, the positively-charged ion beam may generate a positive potential in the substrate. This positive potential may damage an insulating film formed on the substrate. Such damage is commonly called electrostatic damage (ESD). Especially elements including insulating films having line widths of several nanometers, such as a tunneling magnetoresistance (TMR) element, are more likely to suffer electrostatic damage, so it is desirable to suppress a fluctuation in substrate potential in a process of fabricating these elements.

A fluctuation in substrate potential during an etching process is suppressed by emitting electrons which neutralize a positive potential toward the gap between the extraction electrode and the substrate. The electrons are emitted by the neutralizer arranged near the extraction electrode of the ion source. The amount of emitted electrons is adjusted so that the substrate potential has a desired value. The start and end of the etching process is controlled by opening/closing the shutter. During the shutter operation, the amount of ion beam incident on the substrate, and the amount of electrons emitted by the neutralizer fluctuate depending on the opening degree of the shutter. At this time, if the balance between the amount of ion beam incident on the substrate and the amount of electrons emitted by the neutralizer degrades, the substrate potential fluctuates.

FIG. 5 shows the measurement result of the substrate potential (monitor voltage 21) when the shutter opens while the amount of electrons (neutralizing current 21a) emitted by the neutralizer is kept constant, for the sake of descriptive convenience. Referring to FIG. 5, point A indicates the timing at which the shutter starts its opening operation, and point D indicates the timing at which the shutter completes its opening operation. As can be seen from FIG. 5, the substrate potential 21 considerably fluctuates during the shutter operation. Therefore, in a known technique, a fluctuation in substrate potential, which depends on the shutter operation state, is suppressed (see, for example, Japanese Patent Laid-Open Nos. 2002-353172 and 2002-075968).

Japanese Patent Laid-Open No. 2002-353172 discloses a technique of suppressing a fluctuation in substrate potential by controlling the output from the ion source during the shutter opening operation. More specifically, to overcome insufficient neutralization of the substrate potential while opening the shutter, this patent literature describes decremental control of the amount of emitted ion beam or the acceleration voltage of the ion beam while opening the shutter.

Japanese Patent Laid-Open No. 2002-075968 discloses a technique of applying a reverse voltage to a shutter plate to prevent electrons from flowing into the shutter. That is, this patent literature describes a technique of preventing electrons from flowing into the shutter to reduce insufficient neutralization encountered while closing the shutter.

Unfortunately, an apparatus adopted in Japanese Patent Laid-Open No. 2002-353172 has a configuration in which the shutter device can completely isolate the space on the substrate side from the ion beam and electron sources, so the ion beam and the electrons (that is, the plasma) are confined in a tightly-sealed, narrow space between the ion source and the shutter while the shutter is closed. Therefore, the same effect cannot be obtained in a shutter device which does not completely isolate the space on the substrate side and the space in which a plasma is generated, that is, a shutter device which allows the plasma to enter the space on the substrate side even while the shutter is closed.

Also, the technique disclosed in Japanese Patent Laid-Open No. 2002-353172 fluctuates the ion beam amount, so the amount of etching of the substrate may considerably fluctuate during the shutter opening/closing operation, and the quality of an element formed on the substrate may, in turn, fluctuate. Furthermore, the technique disclosed in Japanese Patent Laid-Open No. 2002-075968 applies a voltage to the shutter plate, but can hardly be applied to a shutter device that allows the plasma to enter the space on the substrate side even while the shutter is closed.

SUMMARY

The present invention provides an apparatus and a method advantageous in suppressing a fluctuation in substrate potential to prevent the occurrence of ESD.

Alternatively, the present invention provides an apparatus and a method advantageous in stabilizing the quality of an element formed on a substrate.

The first aspect of the present invention provides an ion etching method of etching a substrate, arranged on a substrate holder, using an ion beam etching apparatus including an ion source which emits an ion beam toward the substrate holder, a neutralizer which emits electrons toward the ion beam, and a shutter capable of moving between a closed position at which the ion beam emitted by the ion source toward the substrate holder is shielded, and an open position at which the ion beam emitted by the ion source toward the substrate holder is not shielded, the method comprising: when the shutter moves from the closed position to the open position, a first step of keeping an amount of the ion beam emitted by the ion source constant, and gradually decreasing an amount of the electrons emitted by the neutralizer; and a second step of setting the amount of the ion beam emitted by the ion source to be equal to the amount of the ion beam emitted by the ion source in the first step, and gradually increasing the amount of the electrons emitted by the neutralizer.

The second aspect of the present invention provides an ion beam etching apparatus including an ion source which emits an ion beam toward a substrate holder, a neutralizer which emits electrons toward the ion beam, a shutter capable of moving between a closed position at which the ion beam emitted by the ion source toward the substrate holder is shielded, and an open position at which the ion beam emitted by the ion source toward the substrate holder is not shielded, and a controller which controls operations of the ion source, the neutralizer, and the shutter, wherein while the shutter moves from the closed position to the open position, the controller controls so as to keep an amount of the ion beam emitted by the ion source constant, and gradually decrease an amount of the electrons emitted by the neutralizer, and then keep the amount of the ion beam emitted by the ion source constant, and gradually increase the amount of the electrons emitted by the neutralizer.

The third aspect of the present invention provides a method of processing a substrate in an apparatus including a substrate holder which holds the substrate, an ion source which emits an ion beam, a neutralizer which emits electrons, and a shutter which is arranged between a space in which the ion source and the neutralizer are arranged and a space in which the substrate holder is arranged, and configured to shield the ion beam traveling toward the substrate, the method comprising: adjusting an amount of electrons which are emitted by the neutralizer and reach the substrate holder during movement of the shutter.

The fourth aspect of the present invention provides an apparatus comprising: a substrate holder which holds a substrate; an ion source which emits an ion beam; a neutralizer which emits electrons; a shutter which is arranged between a space in which the ion source and the neutralizer are arranged and a space in which the substrate holder is arranged, and configured to shield the ion beam traveling toward the substrate; and a controller which adjusts an amount of electrons which are emitted by the neutralizer and reach the substrate holder during movement of the shutter.

Further features of the present invention will become apparent from the following description of exemplary embodiments with reference to the attached drawings.

DESCRIPTION OF THE EMBODIMENTS

An embodiment of the present invention will be described below with reference to the accompanying drawings. Note that members, arrangements, and other features to be described hereinafter merely provide examples in which the present invention is embodied, and do not limit the present invention, so various modifications and changes can be made without departing from the scope of the present invention, as a matter of course.

Figure 1:
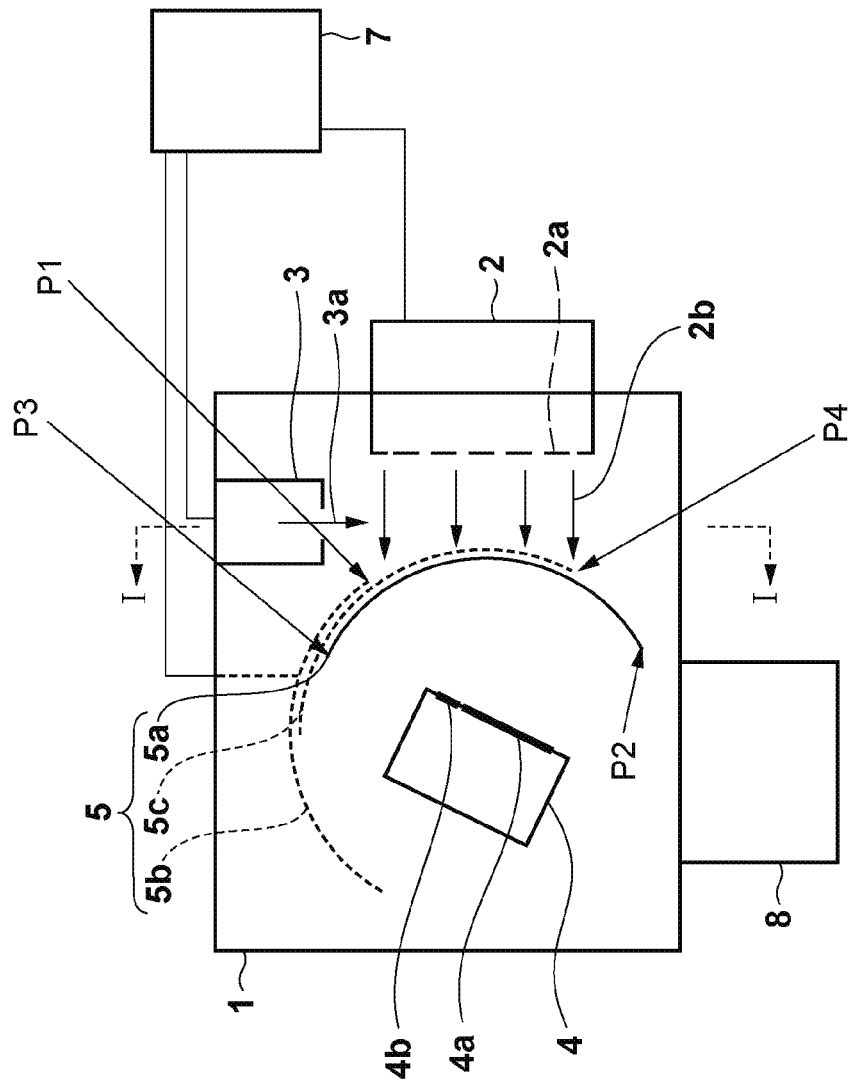
FIG. 1 is a schematic diagram of an ion beam etching apparatus to which the present invention is applicable.
Figure 2:
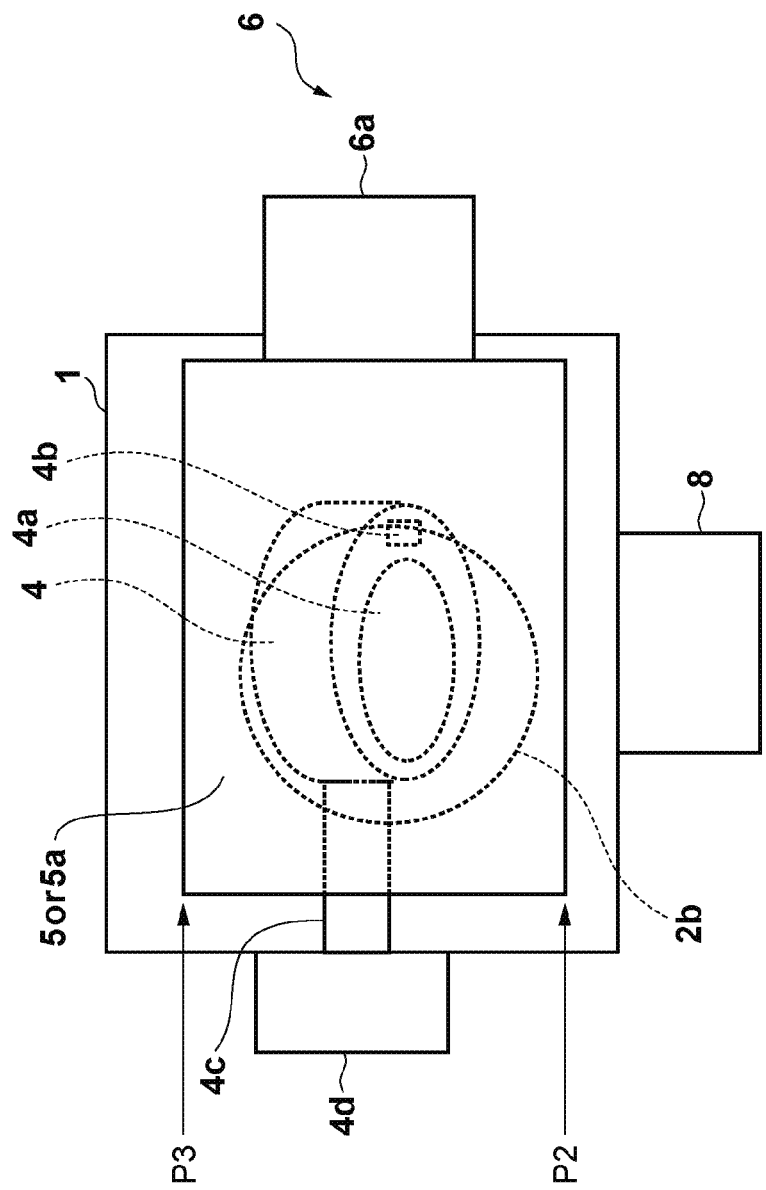
FIG. 2 is a sectional perspective view taken along a line I-I in FIG. 1.
Figure 3:
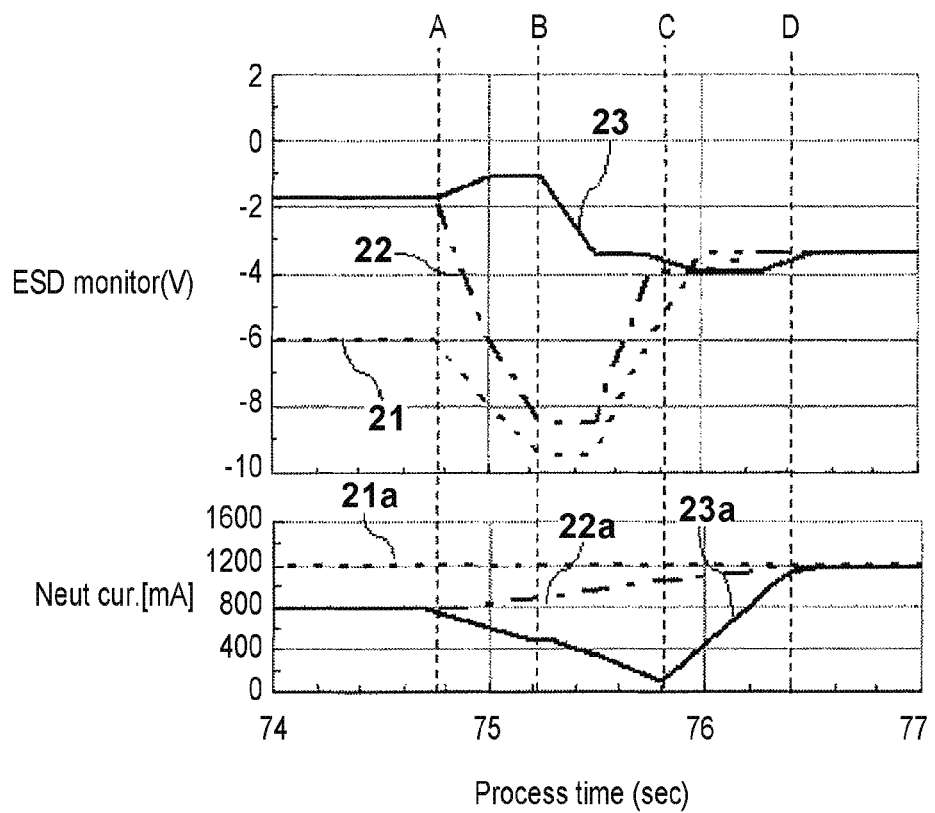
FIG. 3 shows graphs of the measurement results of the neutralizing current and substrate potential.
Figure 4:
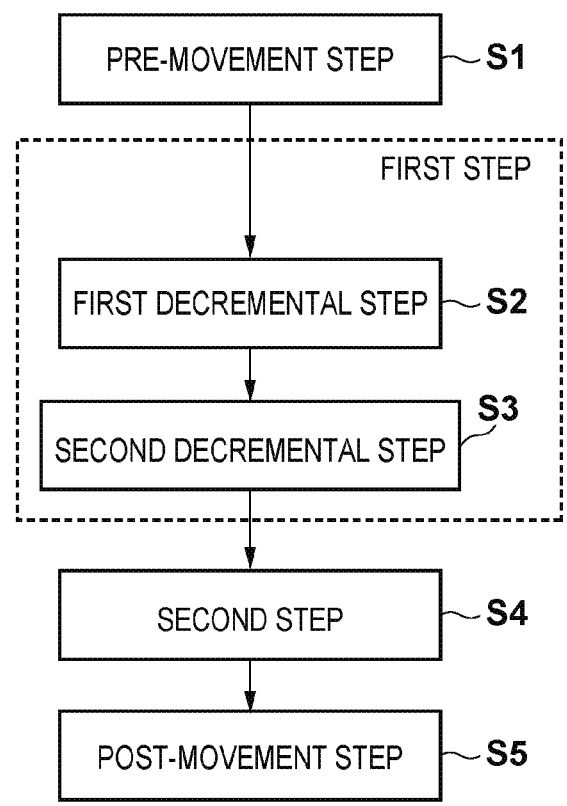
FIG. 4 is a flowchart of control steps executed during the shutter opening operation in the ion beam etching apparatus.

FIGS. 1 to 4 are views for explaining an ion beam etching apparatus or an ion beam etching method according to an embodiment of the present invention, in which FIG. 1 is a schematic diagram of the ion beam etching apparatus; FIG. 2 is a sectional perspective view taken along a line I-I in FIG. 1; FIG. 3 shows the measurement results of the neutralizing current and substrate potential; and FIG. 4 is a flowchart of control steps executed during the shutter opening operation. Note that some members are not shown in these drawings to avoid their complications.

The schematic configuration of the ion beam etching apparatus will be described first with reference to FIGS. 1 and 2. Note that referring to FIG. 2, a substrate holder 4 present on the back side of a shutter 5, for example, is indicated by a broken line, and a neutralizer 3 and a controller 7 are not shown. The ion beam etching apparatus can include a vacuum chamber 1, an ion source 2 which extracts and emits positive ions (ion beam 2b) from a plasma using extraction electrodes 2a, the neutralizer 3 which emits electrons (neutralizing electrons) 3a to neutralize the substrate potential, the substrate holder 4 which holds a substrate 4a at the position where the substrate 4a is irradiated with the ion beam 2b from the ion source 2, a shutter device 6 which is placed between the ion source 2 and the substrate holder 4, and shields the ion beam 2b using the shutter 5, and an exhaust device 8 which evacuates the vacuum chamber 1 into a vacuum. Also, the controller 7 controls, for example, the neutralizer 3, ion source 2, substrate holder 4, and shutter device 6. The ion beam 2b is emitted by the ion source 2 toward the substrate 4a, arranged on the substrate holder 4, so that an ion etching process of etching the substrate 4a can be performed.

The ion source 2 includes an ion source chamber in which a plasma can be generated, a gas introduction device which introduces Ar gas into the ion source chamber, a loop antenna used to generate a plasma in the ion source chamber via a dielectric substance, a plasma generation device which supplies high-frequency power to the loop antenna, and the plurality of extraction electrodes 2a capable of extracting positive ions from the plasma in the ion source chamber. The ion source chamber, gas introduction device, loop antenna, and plasma generation device are not shown. By applying a predetermined voltage to the plurality of extraction electrodes 2a, positive ions can be accelerated to generate the ion beam 2b.

The neutralizer 3 is arranged at the position at which it can irradiate the ion beam 2b traveling from the ion source 2 to the substrate holder 4 with the electrons 3a. A hollow cathode neutralizer, for example, can be adopted as the neutralizer 3. The hollow cathode neutralizer 3 can include a cylindrical electrode (hollow cathode) having its one end closed and its other end open, and an electrode which extracts electrons from a plasma generated in the hollow electrode, and emits them into the vacuum chamber 1. Neither electrode is shown. Note only a hollow cathode neutralizer but also various neutralizers which use different electron emission methods, such as filament and microwave neutralizers, can be adopted, as a matter of course.

The substrate holder 4 can include a chuck device which holds the substrate 4a, and a floating electrode 4b which is placed near the substrate 4a, monitors the surface potential of the substrate 4a, and floats electrically. The substrate holder 4 is supported by a driving shaft 4c, and disposed in the vacuum chamber 1. The substrate holder 4 can rotate the substrate 4a about an axis parallel to a normal to the surface of the substrate 4a. A force can be transmitted to the substrate holder 4 via the driving shaft 4c from, for example, a holder driving device 4d to rotate the substrate 4a. A power supply path through which power is supplied to the chuck device mounted in the substrate holder 4 can also be arranged on the driving shaft 4c. The holder driving device 4d rotates the driving shaft 4c to tilt the substrate holder 4 so as to control the angle of the ion beam 2b with respect to a normal to the surface of the substrate 4a, that is, the incident angle of the ion beam 2b on the substrate 4a.

The shutter device 6 controls a shutter driving device 6a so as to continuously move the shutter 5 from a closed position 5a to an open position 5b. The shutter device 6 includes the shutter 5 and shutter driving device 6a. The shutter 5 can be a plate-shaped member having an arcuated cross-section. The substrate holder 4 is arranged so as to face the interior of the curved portion of the shutter 5. The shutter driving device 6a can move the shutter 5 around the substrate holder 4. The shutter 5 has a width wider than that of the ion beam 2b emitted by the ion source 2 toward the substrate 4a.

A shutter device which rotates or moves a flat plate-shaped shutter may be used in place of the shutter 5 curved in an arcuated shape. However, a flat plate-shaped shutter plate that can be used in place of the shutter 5 needs to allow the plasma to enter the space on the substrate side even while the shutter is closed (while the ion beam is shielded). Note that the shape of the shutter 5 curved in an arcuated shape is more advantageous than a flat plate-shaped shutter in that the former is less likely to interfere with the structure in the vacuum chamber 1, and in that the former requires a smaller space to retract the shutter because the shutter 5 is open at the position to which the shutter 5 moves toward the back side of the substrate holder 4. This makes it possible to downsize the vacuum chamber 1 (ion beam etching apparatus). Also, although the rotation axis of the shutter 5 is set parallel to that of the driving shaft 4c in the ion beam etching apparatus according to this embodiment, the shutter 5 and the driving shaft 4c may be set so that their rotation axes intersect with each other.

The ion beam etching apparatus according to this embodiment employs a structure in which a space (the gap between the shutter 5 and the wall surface of the vacuum chamber 1) into which the ion beam 2b is not emitted falls within the space in which the ion source 2 faces the substrate holder 4, while the shutter 5 is at the closed position 5a, instead of a structure which isolates the space in which the ion source 2 and neutralizer 3 are arranged and that in which the substrate holder 4 is arranged, even while the shutter 5 is at the closed position 5a. Therefore, while the shutter 5 is at the closed position 5a, the ion beam 2b, the electrons 3a, and the plasma mix with each other in the space between the ion source 2 and the shutter 5, so the plasma and the electrons 3a can partially reach the substrate holder 4 present on the back side of the shutter 5 at the closed position 5a by diffusion. The plasma mentioned herein means a plasma which is generated in the ion source 2 and passes through the holes in the extraction electrodes 2a by diffusion. The diffused electrons 3a and the plasma generate a negative potential in the substrate 4a even while the shutter 5 is at the closed position 5a.

The controller 7 is a control device capable of controlling at least the neutralizer 3, ion source 2, and shutter device 6, and includes a program logic controller (PLC) connected to a computer, device drivers connected to respective devices such as the neutralizer 3 and the shutter device to control them, and a recording medium recording a program recipe (program). A signal (opening degree information) indicating the opening degree of the shutter 5, and an operation signal (output information) of the neutralizer 3 and ion source 2 can be input to the controller 7. The opening degree of the shutter 5 is a value that depends on the amount of movement of the shutter 5, and the opening degree information of the shutter 5 can be calculated based on, for example, the measurement value obtained by a motor encoder provided in the shutter device 6. The output information of the neutralizer 3 and ion source 2 is based on the values output to these devices.

The floating electrode 4b serves as a sensor which monitors the potential of the substrate surface (target surface). The monitor voltage (ESD monitor) measured by the floating electrode 4b reflects an actual substrate potential, and tends to shift to the negative potential side by about several volts with respect to the potential of the substrate 4a. That is, in the ion beam etching apparatus, the ion source 2 is designed so that it uniformly irradiates the target surface of the substrate 4a with the ion beam 2b, but irradiates the region which falls outside the target surface of the substrate 4a with the ion beam 2b in a smaller amount.

On the other hand, because the plasma and the electrons 3a diffuse over a wide range in the vacuum chamber 1, the electrons 3a are nearly uniformly present on the substrate holder 4. However, the position of the floating electrode 4b falls outside the outer edge of the substrate 4a, so the monitor voltage during milling (etching process) upon opening the shutter 5 may shift to the negative potential side by about several volts with respect to the actual potential of the substrate 4a. Note that no difference is generated in negative potential between the substrate 4a and the monitor voltage while the shutter 5 is closed (closed position 5a). This is because the substrate holder 4 is not irradiated with the ion beam 2b while the shutter 5 is closed. The controller 7 can adjust the neutralizing current (the output from the neutralizer 3) so that the potential has a desired value while monitoring the monitor voltage of the floating electrode 4b during an etching process.

The position to which the shutter 5 moves will be described herein with reference to FIG. 1. At the open position 5b, the ion beam 2b emitted by the ion source 2 toward the substrate 4a is not shielded. At the open position 5b, the end (denoted by reference symbol P1 in FIG. 1) of the shutter 5 on the side of the ion source 2 is retracted outside the radiation range of the ion beam 2b, so the ion beam 2b emitted toward the substrate 4a, and the electrons 3a traveling toward the substrate 4a are not shielded by the shutter 5. The radiation range of the ion beam 2b means the range of a cross-section (a surface perpendicular to the direction in which the ion beam 2b travels) of the ion beam 2b extracted from the ion source 2. Since the ion beam 2b is extracted by the extraction electrodes 2a, the diameter of the ion beam 2b is nearly equal to that of the extraction electrodes 2a in their vicinities. The area irradiated with the ion beam 2b by a spatial charge effect between the extraction electrodes 2a and the substrate 4a can be larger than the diameter of the extraction electrodes 2a by about several ten percent.

At the closed position 5a, the ion beam 2b emitted by the ion source 2 toward the substrate 4a is shielded by the shutter 5. At the closed position 5a, the ends (denoted by reference symbols P2 and P3 in FIGS. 1 and 2) of the shutter 5 in the vertical direction are positioned to fall outside the radiation range of the ion beam 2b to enclose a range larger than the radiation range of the ion beam 2b, thereby shielding the ion beam 2b. At the closed position 5a, the end (denoted by reference symbol P2 in FIG. 1) of the shutter 5 and the inner surface of the vacuum chamber 1 have a relatively small distance (gap) between them, so the amount of electrons 3a which reach the substrate 4a can be set smaller than that at a half-closed position 5c at which the shutter operation is in progress.

The half-closed position 5c (at which the shutter operation is in progress) is set between the closed position 5a and the open position 5b, and the end (denoted by reference symbol P4 in FIG. 1) of the shutter 5 substantially coincides with that of the radiation range of the ion beam 2b at the half-closed position 5c. The amount of electrons 3a which reach the substrate 4a is larger at the half-closed position 5c than at the closed position 5a. Note that in this embodiment, the moving speed of the shutter 5 is set constant, and it takes one to two sec. for the shutter device to open/close (move) the shutter 5.

An ion beam etching method using the above-mentioned ion beam etching apparatus will be described herein. The ion beam etching method is executed in a process of irradiating the substrate 4a arranged on the substrate holder 4 with the ion beam 2b extracted from the plasma using the above-mentioned ion beam etching apparatus, thereby etching the substrate 4a. The ion beam etching method according to this embodiment has a feature in a method of controlling the neutralizer 3 during an ion beam etching process. A feature of this method lies especially in a method of controlling the neutralizer 3 during shutter movement. Control of the neutralizer 3 will be described below.

FIG. 3 shows the measurement results of the neutralizing current and substrate potential in this embodiment. The measurement results shown in FIG. 3 are represented as timing charts showing changes in neutralizing current and substrate potential when the shutter 5 moves from the closed position 5a to the open position 5b, and include three types of measurement results corresponding to the individual control patterns of the neutralizer 3. FIG. 3 is divided in the upper and lower graphs. The lower graph in FIG. 3 shows the process time (Process time) on the abscissa, and shows the value (Neut cur.) of the current (neutralizing current) supplied to the ion source 2 on the ordinate. The upper graph in FIG. 3 shows the process time (Process time) on the abscissa as well, and shows the monitor voltage (ESD monitor) on the ordinate.

The process time in FIG. 3 means the elapsed time in an ion etching process, and can be defined using an arbitrary point as a reference. The process times in both the upper and lower graphs are measured using the ion etching apparatus shown in FIG. 1. Referring to FIG. 3, point A indicates the timing at which the shutter 5 starts to move from the closed position 5a, and the position of the shutter 5 at point A corresponds to reference numeral 5a in FIG. 1. Point D indicates the timing (open position 5b) at which the shutter 5 moves and opens, and the position of the shutter 5 at point D corresponds to reference numeral 5b in FIG. 1.

Point B indicates that movement of the shutter 5 is in progress, and the position of the shutter 5 at point B corresponds to reference numeral 5c (half-closed position) in FIG. 1. At point B, the shutter 5 shields the ion beam 2b, but allows the electrons 3a to easily diffuse because it opens widely, so the substrate 4a is negatively charged to have a negative potential due to factors associated with the electrons 3a which enter the space on the substrate side upon passing through the lateral sides of the shutter 5. Point C indicates that the shutter 5 is open more widely than at the position denoted by reference numeral 5c (half-closed position) in FIG. 1, and the substrate 4a starts to be irradiated with the ion beam 2b, but the electrons 3a diffuse by an amount larger than that by which the ion beam 2b diffuse, so the substrate 4a has a negative potential. As will be described later, point C indicates the point at which the control step is switched from control for decreasing the neutralizing current to control for increasing it is performed, and is set so that the fluctuation in monitor voltage falls within a predetermined tolerance. In this embodiment, point C is set so that the fluctuation in monitor voltage 23 falls within the range of ±2 V.

The above-mentioned three types of neutralizer control patterns correspond to a Comparative Example, Example 1, and Example 2, and the power supplied to the ion source 2 are the same in all the cases. In the Comparative Example, the shutter 5 opens while the neutralizing current is kept constant (supply pattern 21a). In Example 1, incremental control for increasing the neutralizing current is performed at the start of the shutter operation (current supply pattern 22a). In Example 2, decremental control for decreasing the neutralizing current is performed immediately after the start of the shutter opening operation (point A), and then incremental control for increasing the neutralizing current is performed in the course of the shutter opening operation (point C) (supply pattern 23a). Referring to FIG. 3, reference numeral 21 denotes the monitor voltage of the control pattern according to the Comparative Example; 22, the monitor voltage of the control pattern according to Example 1; and 23, the monitor voltage of the control pattern according to Example 2. Note that decremental control for decreasing the neutralizing current means control for gradually decreasing the neutralizing current in accordance with the opening degree of the shutter 5, and incremental control for increasing the neutralizing current means control for gradually increasing the neutralizing current in accordance with the opening degree of the shutter 5.

Figure 5:
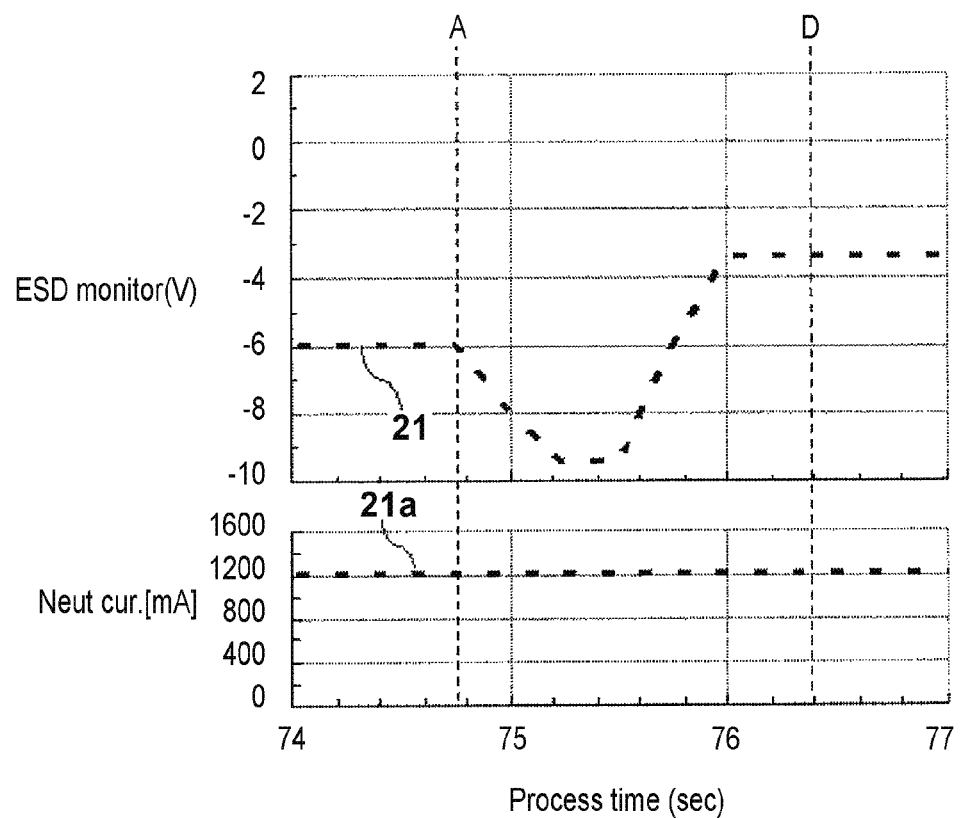
FIG. 5 is a graph showing the measurement result of the substrate potential when the shutter opens while the amount of electrons is kept constant.

A case (Comparative Example) in which the shutter 5 opens while the neutralizing current is kept constant will be described first for the sake of comparison (see FIGS. 3 and 5). While the neutralizing current is kept constant (supply pattern 21a), at the start of the shutter opening operation, the negative potential of the monitor voltage 21 temporarily increases and then decreases and converges to a predetermined value. This reflects the balance between the amount of ion beam 2b which strikes the substrate 4a, and the amounts of diffused plasma and electrons. At the half-closed position 5c at which the operation of the shutter 5 is in progress, the ion beam 2b is completely shielded, but the shutter 5 is absent in the region, which is not irradiated with the ion beam 2b, of the space facing the ion source 2. Accordingly, at the half-closed position 5c, the amounts of plasma and electrons which diffuse toward the substrate holder 4 increase, and the negative potential of the monitor voltage 21, in turn, increases. As the opening degree of the shutter 5 further increases, the substrate 4a starts to be irradiated with the ion beam 2b. Therefore, during the period from when the half-closed position 5c at which the opening operation of the shutter 5 is in progress is set until the open position 5b at which the shutter 5 is completely open is set, the amount of ion beam 2b which strikes the substrate 4a gradually increases, so the negative potentials of the monitor voltage 21 and substrate surface gradually decrease in proportion to the amount of movement of the shutter 5.

In the Comparative Example, the neutralizing current is set to have a predetermined value at which the substrate potential after the shutter 5 opens (point D: the open position 5*b*) has a desired value, with no concern for a change in substrate potential during the opening/closing operation. Thus, the monitor voltage 21 at the closed position (point A) of the shutter 5 has a negative potential (−6 V in FIG. 3) due to factors associated with the diffused plasma and excessive electrons 3*a*. However, to lower the negative potential while the shutter 5 is closed, decreasing the neutralizing current makes it possible to reduce the negative potentials of the monitor voltages 22 and 23, as will be described below.

Note that it is difficult to lower the negative potential, as indicated by the monitor voltage 21, simultaneously with the start of the opening operation of the shutter 5 (point A), using the conventional control scheme in which the output setting of the neutralizing current is changed stepwise at once at the start of the opening operation of the shutter 5. Upon changing the neutralizing current at once simultaneously with the start of the opening operation of the shutter 5 (point A), the amount of electrons 3*a* emitted by the neutralizer 3 changes too early before the shutter 5 moves by a given amount, thus generating a timing at which the balance between the ion beam 2*b* and the electrons 3*a* degrades.

Example 1 in which incremental control of the neutralizing current is performed at the start of the operation (movement) of the shutter 5 will be described. The neutralizing current before the opening operation of the shutter 5 (point A) is set relatively low, and incremental control of the neutralizing current (current supply pattern 22*a*) is performed simultaneously with the start of the opening operation of the shutter 5, thereby making it possible to reduce the negative potential (monitor voltage 22) after the shutter 5 opens (point D). Therefore, the amount of electrons 3*a* emitted by the ion source 2 is gradually increased in accordance with the opening degree of the shutter 5 after the start of the opening operation of the shutter 5. However, as in the above-mentioned Comparative Example, the negative potential reaches a local maximum value before the shutter 5 completely opens, so the effect of suppressing a fluctuation in substrate potential is poor.

Example 2 in which decremental control of the neutralizing current is performed immediately after the start of the opening operation of the shutter 5 (point A), and then incremental control of the neutralizing current is performed in the course of the opening operation of the shutter 5 (point C) will be described. The neutralizing current is controlled as indicated by the supply pattern 23*a*, that is, decremental control of the neutralizing current is performed immediately after the start of the opening operation of the shutter 5 (point A), and then incremental control of the neutralizing current is performed in the course of the opening operation of the shutter 5 (point C), thereby making it possible to suppress a rise in negative potential, as indicated by the monitor voltage 23. In this manner, a plurality of control stages (control steps) in which the neutralizing current is increased/decreased at different rates are set, thereby making it possible to effectively suppress a fluctuation in substrate potential after the start of the opening operation of the shutter 5 (point A).

In Example 2, the rate of decrease in neutralizing current (the gradient of the supply pattern 23*a*) is switched in the course of the opening operation of the shutter 5 (point B), so decremental control is divided in two stages. More specifically, referring to FIG. 3, the controller 7 switches the step of controlling the neutralizing current among five regions (control regions): the region before point A, that from point A to point B, that from point B to point C, that from point C to point D, and that after point D. The control steps are switched with each other in accordance with a program recipe input to the recording medium of the controller 7. However, a control method in which the control steps are switched from each other by referring to the open/closed position of the shutter 5, which is input to the controller 7, can also be used. Note that the amount of ion beam 2*b* remains the same in the five regions (respective control steps). The recording medium means a member having a given storage capacity (storage), such as a memory or a hard disk (HD).

FIG. 4 is a flowchart showing control steps executed during the shutter opening operation. In the opening operation of the shutter 5, five types of control steps are executed in accordance with the opening degree of the shutter 5, as shown in FIG. 4. Each control step will be described with reference to FIG. 4.

Before point A, the shutter 5 is completely closed (closed position 5*a*), so the current (neutralizing current) supplied to the neutralizer 3 is kept constant. At this time, the amount of electrons 3*a* emitted by the neutralizer 3 is constant. A control step of the ion etching apparatus before point A is defined as a pre-movement step (S1).

In the period from point A to point B, the neutralizing current is controlled so as to gradually decrease with reference to that at point A. A change in neutralizing current (supply pattern 23*a*) is not a stepwise change but a continuous change. At this time, the amount of electrons 3*a* emitted by the neutralizer 3 also gradually decreases. In the period from point A to point B, the amount of electrons 3*a* which reach the surface of the substrate 4*a* is larger than that before point A, so it is necessary to decrease the amount of electrons 3*a* to neutralize a change in substrate potential. A control step of the ion etching apparatus in the period from point A to point B is defined as a first decremental step (S2).

In the period from point B to point C, the neutralizing current is controlled so as to further decrease from that at point B. As in the period from point A to point B, a change in neutralizing current (supply pattern 23*a*) is a continuous change, but the gradient at which the supply pattern 23*a* decreases is slightly larger than that in the period from point A to point B. At this time, the gradient at which the amount of electrons 3*a* emitted by the ion source 2 decreases also increases. In the period from point B to point C, the amount of electrons 3*a* which reach the surface of the substrate 4*a* is larger than that in the period from point A to point B, so it is necessary to further decrease the amount of electrons 3*a* to neutralize a change in substrate potential. A control step of the ion etching apparatus in the period from point B to point C is defined as a second decremental step (S3). Note that the control steps (first decremental step S2 and second decremental step S3) in which the neutralizing current is temporarily decreased in the periods from point A to point C are collectively defined as a first step.

In the period from point C to point D, the neutralizing current is controlled so as to gradually increase with reference to that at point C. A change in neutralizing current in the period from point C to point D is a continuous change. At this time, the amount of electrons 3*a* emitted by the neutralizer 3 gradually increases. As the shutter 5 opens to a degree larger than that to which it opens at the position defined by point C, the amount of ion beam 2*b* which strikes the surface of the substrate 4*a* gradually increases, so it is necessary to increase the amount of electrons 3*a* to neutralize a change in substrate potential. Note that a control step in which the neutralizing current is increased in the period from point C to point D is defined as a second step (S4).

After point D, the shutter 5 is open (open position 5b), and the neutralizing current is kept constant. At this time, the amount of electrons 3a emitted by the neutralizer 3 is constant. However, the balance between the ion beam 2b and the electrons 3a after point D is different from that before point A (closed position 5a), so the neutralizing current value after point D is set slightly higher than that before point A. A control step of the ion etching apparatus after point D is defined as a post-movement step (S5).

Although multistage control is done so that the neutralizing current value changes at a rate which varies in each individual region in Example 2, control that uses a curved profile may be done to prevent a rapid change in control current in the boundary region between adjacent regions. Also, the control stages may further be divided into a plurality of stages, as a matter of course. As control of the neutralizing current during opening/closing of the shutter 5, continuous decremental control of the neutralizing current value can be performed while the output from the ion source 2 is kept constant, as in Example 1, or the neutralizing current can temporarily be decreased and then increased while the output from the ion source 2 is kept constant, as in Example 2.

Since the substrate potential is determined depending on the balance between the ion beam 2b and the electrons 3a, a fluctuation in substrate potential can also be suppressed by controlling the extraction current and extraction voltage of the ion source 2 while the neutralizing current is kept constant. At this time, the extraction current and extraction voltage of the ion source 2 are controlled so as to change as the shutter 5 moves. Multistage control steps can be set in the same way as in neutralizing current control.

Although neutralizing current control in the opening operation of the shutter 5 has been described in each of the above-mentioned Examples, the present invention is also applicable to neutralizing current control in the closing operation of the shutter 5, as a matter of course. When the present invention is applied to the closing operation of the shutter 5, neutralizing current control in the above-mentioned Example 1 or 2 need only be performed in reverse order. When control in Example 1 is applied to the closing operation of the shutter 5, the amount of electrons 3a emitted by the neutralizer 3 gradually decreases, compared to that before movement of the shutter 5. Also, when control in Example 2 is applied to the closing operation of the shutter 5, the neutralizing current starts to be decreased immediately after the start of the closing operation of the shutter 5 (corresponding to point D), and is gradually increased in the period from when the shutter 5 reaches point C until it reaches point A. The gradient of the supply pattern of the neutralizing current may be changed in the period from point C to point B and that from point B and point A, as a matter of course.

Control of the ion etching apparatus will be described herein. The controller 7 includes a recording medium recording a program recipe (a program or a program computer) for executing the above-mentioned ion etching method, and controls the neutralizer 3, the ion source 2, the driving device of the shutter device, and the substrate holder 4 (each device) in accordance with this program. That is, the controller 7 reads out the program recipe from the recording medium, and sends a command to the PLC in accordance with this program recipe. Then, the PLC sends a command associated with a detailed operation to each device driver to control each device. At this time, the PLC and each device driver refer to information fed back from each device as needed.

The recording medium stores at least program recipes (computer programs) including commands according to which the above-mentioned first and second steps are executed. The program recipe (decremental control program) for executing the first step includes at least a command to start the opening operation of the shutter 5 at a predetermined timing, and a command to gradually decrease the neutralizing current of the neutralizer 3 without changing the ion current of the ion source 2. When the above-mentioned first and second decremental steps are executed as the first step, the program recipe for executing the first step is also programmed so that the neutralizing current decreases in two stages.

Similarly, the program recipe (incremental control program) for executing the second step includes at least a command to increase the neutralizing current of the neutralizer 3 by a predetermined amount at the timing, at which the shutter 5 opens by a predetermined amount, without changing the ion current of the ion source 2. Since an ion etching apparatus in which the moving speed of the shutter 5 is set constant is employed in this embodiment, the timing at which a command to change the neutralizing current of the neutralizer 3 is executed is set to be a predetermined time after the start of the opening operation of the shutter 5.

However, when the moving speed of the shutter 5 is not set constant, the substrate potential can be controlled by changing the neutralizing current in accordance with the opening degree information of the shutter 5. This can be done because the substrate potential and the opening degree of the shutter 5 have a correlation. Also, feedback control for determining the neutralizing current while referring to the value of the floating electrode 4b so that the potential of the floating electrode 4b has a desired value may be performed. In feedback control for determining the neutralizing current by referring to the value of the floating electrode 4b, setting according to which the state (opening degree information) of the shutter 5 and pieces of information such as the angles of the ion source 2 and substrate holder 4 are referred to can be performed.

That is, examples of the timing at which a command to change the neutralizing current of the neutralizer 3 is executed include a process based on the time elapsed from the start of the opening operation of the shutter 5, a process based on the opening degree information of the shutter 5, a process based on the value of the floating electrode 4b, and a process of referring to both the opening degree information of the shutter 5 and the value of the floating electrode 4b. Among these processes, the process of referring to the time elapsed from the start of the opening operation of the shutter 5, and the process of referring to the opening degree information of the shutter 5 are executed without referring to the value of the floating electrode 4b, thus making it possible to appropriately suppress a fluctuation in substrate potential even if the value of the floating electrode 4b contains noise or errors in large amounts. Also, because the value of the floating electrode 4b and the opening degree information of the shutter 5 have a correlation, a process abnormality can also be detected by referring to both these pieces of information and analyzing them.

An effect of this embodiment will be described lastly. This embodiment provides a method suitable for an etching process by an ion beam etching apparatus including a shutter device which does not completely shield the plasma and electrons 3a that reach the substrate 4a even while the shutter 5 is at the closed position, and prevents the electrons 3a from flowing into the shutter 5. According to this embodiment, the occurrence of ESD can effectively be prevented by suppressing a fluctuation in substrate potential. Thus, the present invention can more suitably be applied to the manufacture of an element having a small element size and is vulnerable to electrostatic damage (ESD), such as a TMR head used for a reading sensor of a magnetic recording device, than the prior art techniques.

Also, according to this embodiment, by controlling the substrate potential during the opening operation of the shutter 5 with a change in amount of electrons 3a emitted by the neutralizer 3 to suppress a fluctuation in substrate potential, the occurrence of ESD can be prevented. This makes it possible to prevent a fluctuation in etching speed during the opening operation of the shutter 5 without requiring decremental control of the acceleration voltage or the amount of emitted ion beam 2b, thus more precisely controlling the amount of etching. Moreover, according to this embodiment, since the substrate potential is controlled using electrons which have a small mass and diffuse at high speed, the response time can be shortened compared to a method of controlling the substrate potential by the ion beam 2b, thus more precisely controlling the amount of etching.

The present invention is not limited to an ion beam etching apparatus, and is applicable to all apparatuses which use shutters to control irradiation of substrates with ion beams, and processes in these apparatuses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-276556, filed Dec. 13, 2010, which is hereby incorporated by reference herein in its entirety.

What is claimed is:

1. A computer-readable recording medium encoded with a computer program for executing an ion etching method of etching a substrate, arranged on a substrate holder, using an ion beam etching apparatus including an ion source which emits an ion beam toward the substrate holder, a neutralizer which emits electrons toward the ion beam, and a shutter capable of moving between a closed position at which the ion beam emitted by the ion source toward the substrate holder is shielded, and an open position at which the ion beam emitted by the ion source toward the substrate holder is not shielded, the ion etching method comprising:
when the shutter moves from the closed position to the open position,
a first step of gradually decreasing an amount of the electrons emitted by the neutralizer while keeping an amount of the ion beam emitted by the ion source constant; and then
a second step of gradually increasing the amount of the electrons emitted by the neutralizer while keeping the amount of the ion beam emitted by the ion source to be equal to the amount of the ion beam emitted by the ion source in the first step;
wherein the ion source, the neutralizer and the shutter are arranged such that the electrons emitted by the neutralizer can partially reach the substrate
when the shutter is arranged at the closed position; the computer program comprising:
a decremental control program having a command according to which the first step is executed; and
an incremental control program having a command according to which the second step is executed.

2. The computer-readable recording medium according to claim 1, wherein:
the first step includes a first decremental step of decreasing the amount of the electrons, emitted by the neutralizer, at a predetermined rate corresponding to an amount of movement of the shutter, and a second decremental step of decreasing the amount of the electrons, emitted by the neutralizer, at a rate different from the predetermined rate after the first decremental step.

3. The computer-readable recording medium according to claim 1, wherein:
when the shutter moves from the open position to the closed position,
the amount of the ion beam emitted by the ion source is controlled to be constant during movement of the shutter, and
the amount of the electrons emitted by the neutralizer is controlled so as to temporarily decrease, compared to the amount of the electrons emitted by the neutralizer before movement of the shutter, and then increase.

* * * * *